United States Patent
Song et al.

(10) Patent No.: US 6,197,615 B1
(45) Date of Patent: Mar. 6, 2001

(54) METHOD OF PRODUCING LEAD FRAME HAVING UNEVEN SURFACES

(75) Inventors: Gun Ho Song; Si Chan Sung, both of Asan (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/369,897

(22) Filed: Aug. 9, 1999

Related U.S. Application Data

(62) Division of application No. 09/045,375, filed on Mar. 20, 1998.

(30) Foreign Application Priority Data

Apr. 4, 1997 (KR) .................................................. 97-12453

(51) Int. Cl.[7] .................................................. H01L 21/44
(52) U.S. Cl. ........................... 438/111; 438/123; 438/112
(58) Field of Search .................................... 438/111, 112, 438/123, 124, 127

(56) References Cited

U.S. PATENT DOCUMENTS

| | | |
|---|---|---|
| 4,910,577 | 3/1990 | Sonoda et al. . |
| 4,942,452 | 7/1990 | Kitano et al. . |
| 4,974,057 | 11/1990 | Tazima . |
| 5,126,820 | 6/1992 | Brown . |
| 5,327,008 | 7/1994 | Djennas et al. . |
| 5,358,906 * | 10/1994 | Lee ........................................ 438/123 |
| 5,406,700 * | 4/1995 | Ito ......................................... 438/123 |
| 5,459,103 | 10/1995 | Kelleher et al. . |
| 5,497,032 * | 3/1996 | Tsuji et al. ............................ 257/710 |
| 5,519,251 | 5/1996 | Sato et al. . |
| 5,559,366 * | 9/1996 | Fogal et al. ........................... 257/666 |

FOREIGN PATENT DOCUMENTS

| | | |
|---|---|---|
| 405218275 | 8/1993 | (JP) . |
| 6-21305 * | 1/1994 | (JP) ..................................... 257/669 |
| 6-085133 | 3/1994 | (JP) . |
| 86-2869 | 8/1985 | (KR) . |

* cited by examiner

*Primary Examiner*—Kevin M. Picardat
(74) *Attorney, Agent, or Firm*—Jones Volentine, L.L.P.

(57) ABSTRACT

A lead frame for manufacturing semiconductor device packages has inner leads, tie bars and a die pad that are formed with irregular dimples on their respective upper and lower surfaces. This improves the bonding strength between the lead frame and the molding compound as well as between the die pad and a semiconductor device. The dimples are formed during the manufacture of the lead frame which allows the lead frame to be economically and easily manufactured.

9 Claims, 4 Drawing Sheets

METHOD OF PRODUCING LEAD FRAME HAVING UNEVEN SURFACES

CROSS REFERENCE TO RELATED APPLICATIONS

This is a divisional application of application Ser. No. 09/045,375 filed Mar. 20, 1998, which is hereby incorporated by reference in its entirely.

BACKGROUND OF THE INVENTION

1. Field of the Invention

The present invention relates to a lead frame and production method thereof, used for manufacturing semiconductor device packages. More particularly, the present invention relates to a lead frame employed for manufacturing packages of semiconductor devices including integrated circuit (IC) devices, where the bonding strength between the lead frame and the molding compound for encapsulating the package is improved.

2. Description of the Related Art

In general, the lead frame employed for producing packages of semiconductor devices is manufactured and supplied as a strip consisting of a plurality of lead frames. The lead frame strip includes carrier rails and guide holes for supporting and holding each unit of the lead frame. Each unit of the lead frame includes a plurality of inner leads integrated with a plurality of outer leads, tie bars, and a die pad. The die pad is formed at the center of the lead frame and has an area where a semiconductor device is mounted.

In a plastic semiconductor device package, a plastic molding compound such as EMC (epoxy molding compound) forms a package body and encapsulates the device and electrical interconnections. A problem with such packages is that debonding between the lead frame and the molding compound causes failure of the package. Debonding occurs as a result of moisture penetration into the molding compound. In effect, moisture in the molding compound vaporizes during curing and test processes, which are performed under high temperature conditions, resulting in debonding of the molding compound from the lead frame.

Debonding failure becomes more serious as the semiconductor device packages are downsized. To solve the problems related to debonding failure, many efforts to improve the bonding strength between the lead frame and the molding compound have been made and include for example, the formation of dimples on the die pad of the lead frame, and the development of new molding compounds.

In an attempt to preserve bonding between the molding compound and the lead frame even under conditions of high temperature and high humidity, conventional etched lead frames are formed with dimples on the lower surface of the die pad. Also, conventional stamped frames are formed with slots or punched out areas on the die pad. The formation and the structure of dimples or slots on the die pad of lead frames is disclosed for example, in U.S. Pat. No. 4,942,452, U.S. Pat. No. 5,459,103 and U.S. Pat. No. 4,910,577.

The cost of etching dimples on the lower surface of the die pad of an etched lead frame is two to three times the cost of stamped lead frames. Moreover, when the lead frame is formed with dimples on the lower surface of the die pad, the debonding problem merely shifts from the die pad to the inner leads.

In the case of a stamped lead frame, since it is difficult to form uniform dimples, slots are usually formed. However, when slots are formed, it is difficult to attach the semiconductor device onto the die pad while bypassing the slots, and a complicated apparatus is required to attach the device. Punching the bottom surface of die pad to mimic the formation of dimples is less effective than forming the dimples themselves.

Accordingly, a need exists for a lead frame that can be mass produced and prevents debonding, but that is free from the disadvantages of conventional lead frames.

SUMMARY OF THE INVENTION

In one aspect, the present invention provides a lead frame including a lead frame body and tie bars integrally coupled to the lead frame body. A die pad is coupled to the tie bars and has an upper surface for mounting a semiconductor device thereon and a lower opposing surface. The surfaces of the inner leads of the lead frame, the tie bars, and the die pad are substantially formed with dimples.

The term "substantially formed" or "substantially provided on" as used herein means that the lead frame is formed with, or the produced lead frame has, dimples provided on most of its entire surface, preferably on at least 60% of its entire surface, more preferably on at least 80%, even more preferably on at least 90%. Most preferably, only a portion of the upper surface of the terminal ends of the inner leads is free from dimples. As used herein, the term "entire surface" means the entire opposing upper and lower planer surfaces of the lead frame including the lead frame body, tie bars, die pad and leads.

The present invention further provides at least one semiconductor device having a plurality of bonding pads, with the device being bonded to the upper surface of the lead frame. A plurality of electrical connections are provided between the bonding pads and the respective terminal ends of the inner leads of the lead frame. An encapsulant covers the lead frame, the semiconductor device and the electrical connections.

In another aspect, the present invention provides a method for producing a lead frame, including the steps of (i) preparing a lead frame material; (ii) modifying one or more surfaces of the lead frame material to produce an uneven surface; (iii) leveling the modified lead frame material; and (iv) stamping the lead frame material to produce a desired lead frame shape.

BRIEF DESCRIPTION OF THE DRAWINGS

These and various other features and advantages of the present invention will be described with reference to the accompanying drawings, in which.

DETAILED DESCRIPTION OF THE INVENTION

Figure 1A:
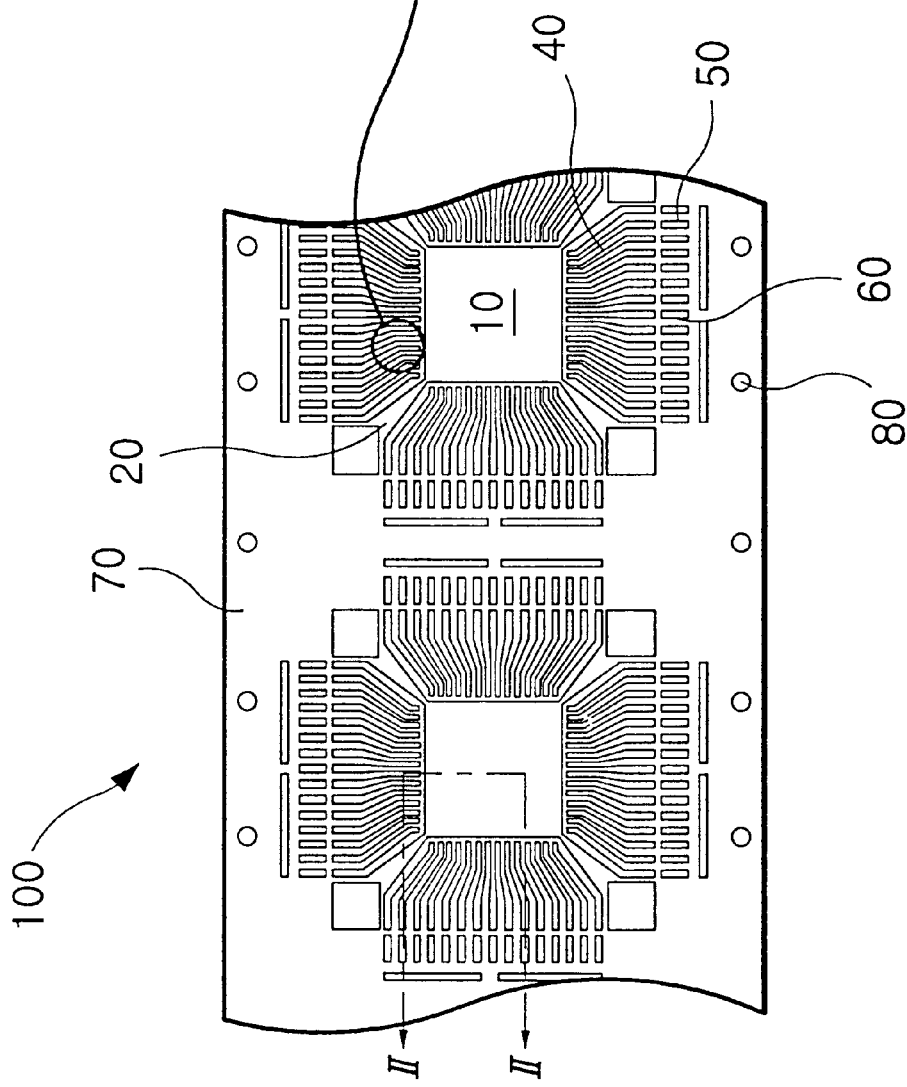
FIG. 1A is a plan view depicting the lead frame according to the present invention.

The present invention will now be described in detail hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numerals refer to like elements throughout.

Figure 1B:
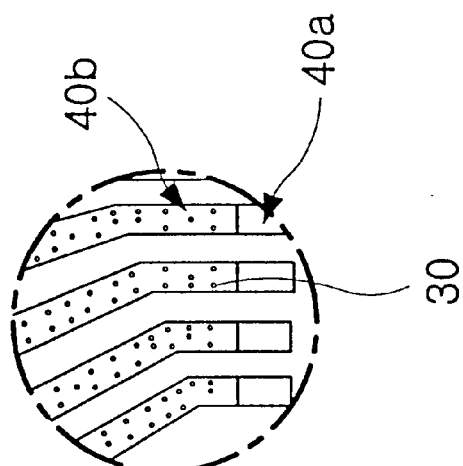
FIG. 1B is an enlarged view of a portion of the inner leads of the lead frame of FIG. 1A.
Figure 2:
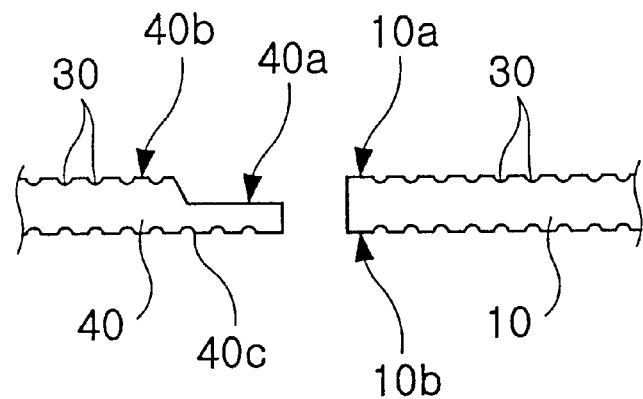
FIG. 2 is a sectional view taken along the line 'II—II' in FIG. 1A.

With reference to FIG. 1 and FIG. 2, the lead frame 100 includes a frame body (or guide rail) 70. Tie bars 20 are integrally coupled at one end to frame body 70, and at the other end to a die pad 10. Die pad 10 has an upper surface 10a where at least one semiconductor device 14 (see FIG. 3) is mounted and a lower opposing surface 10b at the reverse side of the upper surface 10a. Lead frame 100 further includes inner leads 40 extending toward die pad 10 and outer leads 50 integrated with the respective inner leads 40. Dam bars 60 are formed perpendicular to inner leads 40 and outer leads 50 to partition the leads and block the flow of molding compound during the encapsulation process.

In the present invention, die pad 10, tie bars 20, and inner leads 40 are substantially formed with dimples 30 along nearly all of their respective upper and lower planar surfaces. The dimples 30 are of various sizes and are randomly formed.

As described previously, conventional lead frames are formed with regular and uniform dimples present only on one surface of the die pad. On the other hand, the dimples 30 of the lead frame according to the present invention are irregular and are randomly formed throughout the entire surface of the die pad 10 (i.e., upper 10a and lower 10b surfaces), the tie bars 20, and substantially formed on the entire surface of the inner leads 40, except for an upper surface 40a of the terminal end of the inner lead 40. The present lead frames can be applied to the same types of packages as with conventional lead frames, including for example, SOJ (Small outline 'J' bended package) lead frames, TSOP (Thin small outline package) lead frames, and TQFP (Thin quad flat package) lead frames.

Figure 3:
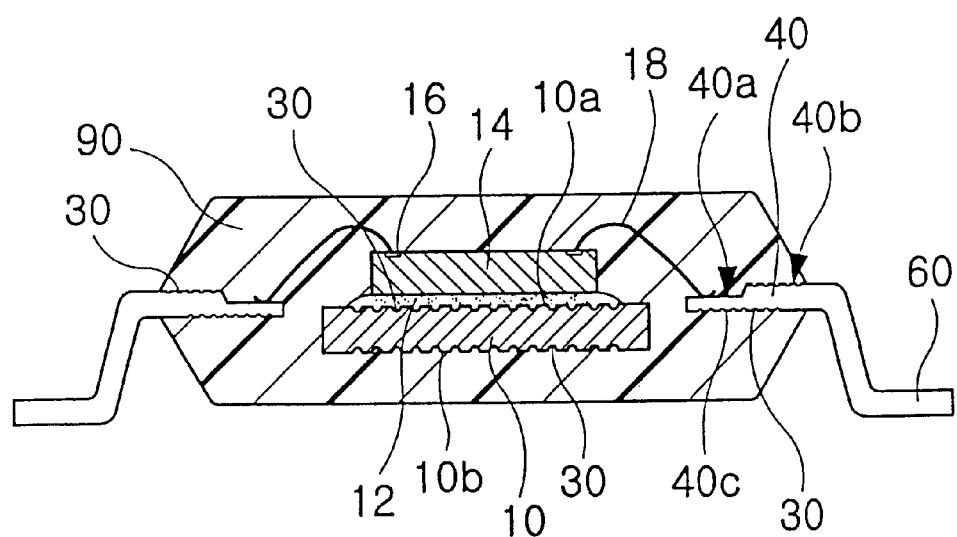
FIG. 3 is a sectional view depicting an embodiment of the semiconductor device package employing the lead frame according to the present invention.

FIG. 3 is a sectional view depicting a semiconductor device package according to the present invention. Semiconductor device 14 is attached to the upper surface 10a of die pad 10 by an adhesive 12, for example, Ag-epoxy adhesive, and has a plurality of bonding pads 16 at its upper surface. Bonding pads 16 are electrically connected to the upper surface 40a of the terminal end of the inner lead 40 by bonding wires 18. The device 14, electrical interconnections 18 and inner leads 40 are encapsulated with a molding compound 90 to produce a package body and protect the semiconductor device from hostile external environments.

Notice that the die pad 10 is formed with dimples 30 along its upper 10a and lower 10b surfaces. The dimples 30 formed on the upper surface 10a of the die pad 10 enhance the bonding strength between the die pad 10 and the semiconductor device 14 mounted thereon by increasing the contact area between them. The dimples 30 formed on the lower surface 10b of the die pad 10 enhance the bonding strength between the die pad 10 and the molding compound 90 in the same way, namely, by increasing the contact area between them. Also, the tie bars 20 are formed with dimples 30.

The inner leads 40 also have dimples 30 formed on the upper 40b and lower 40c surfaces thereof, substantially within the area comprising the molding compound 90. The upper surface 40a of the terminal end of the inner leads 40 that extends toward die pad 10 must be electrically connected to a respective bonding pad 16 on semiconductor device 14 via the bonding wires 18. Therefore, this upper surface area 40a is flattened using a coining process carried out by a press so that there are no dimples 30 in this area.

Figure 4:
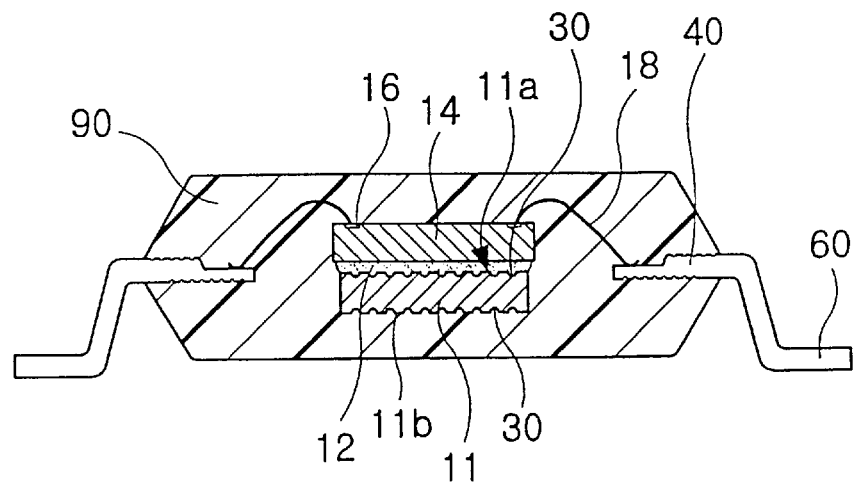
FIG. 4 is a sectional view depicting another embodiment of the semiconductor device package employing the lead frame according to the present invention.

FIG. 4 is an another embodiment of a SDP (Small die pad) semiconductor device package in which die pad 11 is smaller than the device 14. As in the previous embodiment, die pad 11 has dimples 30 on both the upper 11a and lower 11b surfaces, which increase the surface area and thus the bonding strength between die pad 11 and device 14, and between die pad 11 and molding compound 90.

Figure 7:
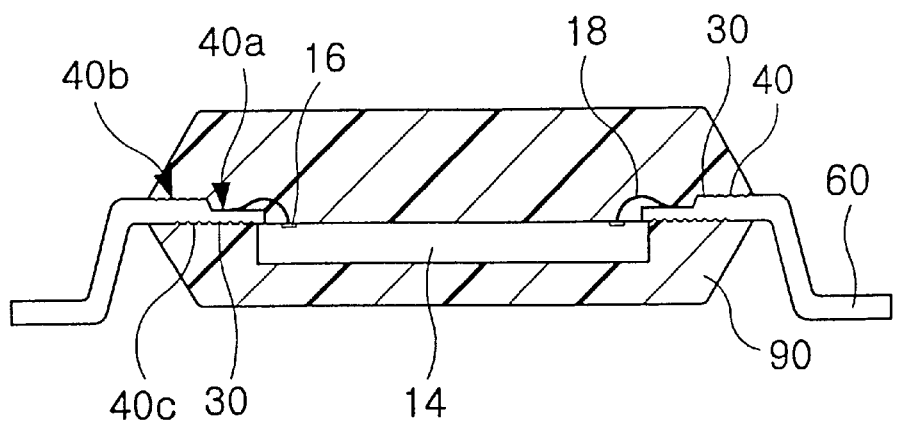
FIG. 7 is a sectional view depicting still another embodiment of the semiconductor device package employing the lead frame according to the present invention.

As shown in FIG. 7, the present invention may also be applied to LOC (Lead-On-Chip) packages where the inner leads 40 are directly attached to the semiconductor device 14 without using a die pad. Thus, dimples 30 are formed on inner leads 40 and tie bars 20 to increase the bonding strength between the molding compound 90 and the lead frame.

Figure 5:
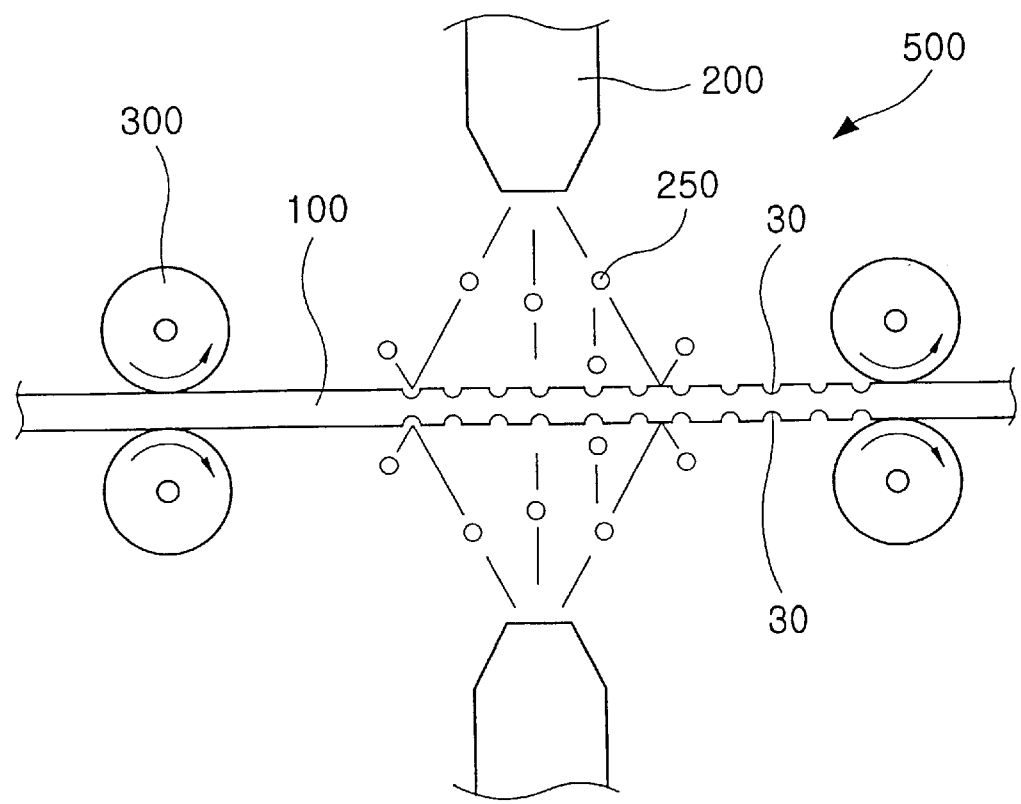
FIG. 5 is a schematic view depicting the formation of dimples on the surfaces of lead frame using a jet nozzle according to the present invention.

FIG. 5 schematically depicts a mechanical surface modification apparatus 500 and a process of forming dimples on the surfaces of a lead frame according to the present invention. As the lead frame 100 is transferred by transfer apparatus 300, the dimples 30 are formed on the upper and lower surfaces of lead frame 100, by impacting suitable particle media 250 from an injection means such as nozzles 200. The particle media 250 should be sufficient to form the dimples without shattering the particle media 250. Those areas of the lead frame where dimple formation is not desired, such as the outer leads, may be protected from impact by the particle media by a suitable mask.

The apparatus 500 for forming dimples on the lead frame, by injecting media from the nozzles while continuously transferring the lead frame, can be readily made by those of ordinary skill in the art in view of the present disclosure, without undue experimentation, from conventional components.

Figure 6:
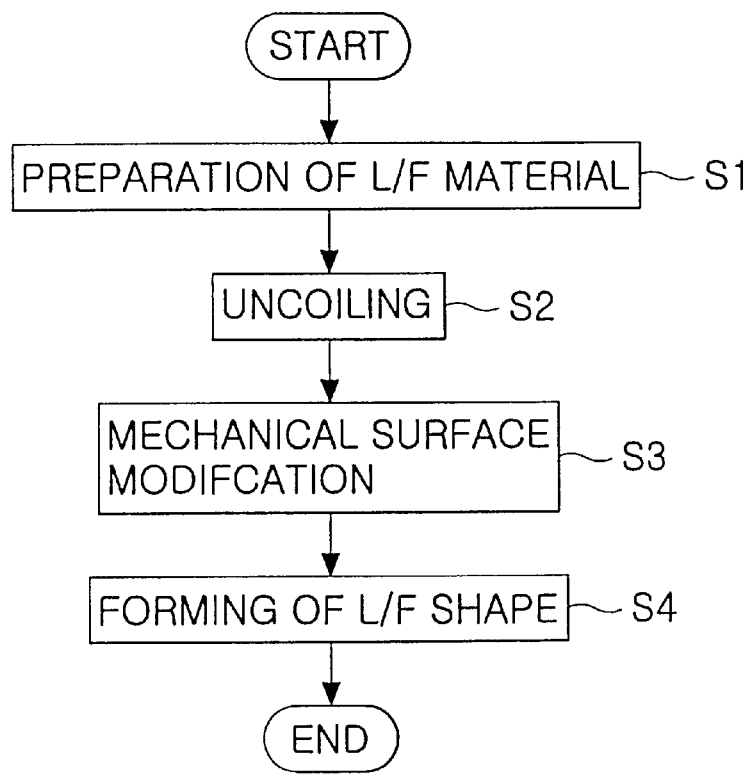
FIG. 6 is a flow chart depicting the production process of the lead frame according to the present invention.

The dimples are formed on the lead frame material prior to press processing which will give a certain shape to the lead frame. The process for producing the dimpled lead frame is described with reference to FIG. 6. Generally, the lead frame material is prepared (S1) and then subjected to an uncoiling process (S2). Then, the mechanical surface modification process is performed (S3) to form dimples on the surfaces of the lead frame and subsequently, press processing (S4) is carried out to give a certain shape to the lead frame.

Each step of the production process is described in more detail hereinafter. In step S1, the lead frame 100 is usually made from electrically conductive materials including for example, copper or copper alloys, and supplied to consumers in the 15 form of a reel of thin tape or coil for ease of storage and handling. The lead frame is then smoothed and straightened by the uncoiling process (step S2) which is carried out using a turntable and an uncoiler. The reel of lead frame material is interlaid with a reel paper to prevent damage to the lead frame material, which paper is removed during the uncoiling process.

In step S3, the lead frame material 100 is introduced into the mechanical surface modification apparatus 500 using a transfer apparatus 300. The mechanical surface modification apparatus 500 is provided with a loader or feeder for introducing the lead frame material into the apparatus. The apparatus is further provided with an unloader which unloads the lead frame, which is formed with dimples, from the apparatus and transfers it to a subsequent process. The loader and unloader can be manufactured by one of ordinary skill in the art to which the present invention pertains without undue experimentation using conventional techniques.

Returning to FIG. 5, the mechanical surface modification apparatus 500 is provided with nozzles 200 at upper and lower positions defining a path therebetween through which the lead frame material travels. The nozzles 200 inject particle media 250 onto the lead frame material 100 using, for example, compressed air containing the particle media 250. More specifically, the compressed air containing the particle media 250 is injected by a jet nozzle or sprayer onto the lead frame material so that the particle media 250 can collide with the surfaces of the lead frame material 100 to form dimples 30 on the surfaces. By providing nozzles 200 at both of the upper and lower positions, the pressure or stress caused by the injection of the compressed air can be balanced at the upper and lower surfaces of the material.

Suitable particle media 250 include for example, plastic resins, silicone resins, glass, or nutshell scraps having an average diameter of about 5 to 200 $\mu$m. The concentration of the particle media in the compressed air is in the range from about 100 g/l to about 200 g/l. The injection pressure of the compressed air is in the range from about 1.2 kg/cm$^2$ to about 4.5 kg/cm$^2$, preferably about 2.3 kg/cm$^2$, and more preferably about 2.3 kg/cm$^2$.

The particle media 250 pass through the nozzle 200 and are sprayed toward the surfaces of the lead frame 100 together with the compressed air. The impact of the particle media 250 with the surfaces of the lead frame 100 creates dimples 30 on the surfaces. The depth of the dimples 30 is preferably in the range of from about 5 $\mu$m to about 200 $\mu$m.

The thus formed dimples 30 have an irregular arrangement and shape, since the particles of the media have different shapes and collide with the surfaces of the lead frame 100 at different incidence angles, thereby producing different shapes and sizes of dimples. Also, the larger particle media 250 produce larger and deeper dimples 30.

The size, number and shape of the dimples 30, while random and irregular, can be controlled within any desired range by adjusting the size and concentration of the particle media 250 contained in the compressed air, and the injection pressure of the air.

For example, when a larger number of dimples is desired, the density of the media in the compressed air can be adjusted to about 180 to 200 g/l, or the transfer speed of the lead frame material passing through the apparatus can be reduced. When deeper dimples are desired, the size, material or shape of media can be changed, or the pressure of injecting the media can be increased. When provided with the foregoing guidelines, one of ordinary skill in the art can readily select suitable transfer speeds for the lead frame, injection pressures for the nozzles, and particle size, concentration, and composition, for a particular application without undue experimentation.

The nozzles 200 would be connected to a compressed air supply and to a compressed air outlet, and provided with a pressure controlling device and an apparatus for introducing and mixing the media into the compressed air. The incorporation of media into the compressed air can be performed using conventional methods, for example employing venturi principles. In addition, the present invention may also utilize compressed air containing water, where the water impacts the lead frame material to form uniform dimples.

Returning to FIG. 6, the lead frame material 100 formed with dimples 30 is thereafter subjected to a conventional lead frame manufacturing process. However, before introducing the modified lead frame material to the press process, the modified material is preferably passed between two opposing rollers to smooth the material and is then treated with a leveler or roller straightener to prevent the material from drooping and to allow for easy introduction of the material into the press. The lead frame material is then successively subjected to conventional feeder and stamping processes. The feeder controls the introduction of the material into a stamping press so that a certain length of the material per each stroke of the press can be fed into the press. In the stamping process, the material is cut to have a certain shape. Further, the material is subjected to a coining process in which the upper surface 40a of the terminal end of the inner leads 40 is flattened. During this coining process, the dimples 30 formed on the flattened terminal end are removed, which improves the bonding strength of the electrical connection between the inner leads 40 and wires 18. Alternatively, the upper surface 40a of the terminal end could be masked during the mechanical surface modification process to prevent contact by the particle media so that dimples are not formed in this region.

The present invention provides several advantages. Since the dimples are formed on the upper and lower surfaces of the die pad, inner leads and tie bars of the lead frame, debonding between the inner leads and die pad, or between the lead frame and the molding compound is significantly decreased by approximately 50%. Consequently, the incidence of debonding or delamination failures of the package decreases, and the reliability of the package increases.

Further, the resultant strong bonding provided by the dimples on the lead frame surfaces eliminates the need to use an expensive low stress EMC that, prior to the present invention, had been used in an attempt to achieve a stronger bond with the lead frame.

The lead frame according to the present invention can also be applied to small die pad packages, which packages require stronger bonding between the die pad and the semiconductor device due to a smaller bonding area between the die pad and the device.

Since the lead frame of the present inventive method can be mass produced, it provides clear advantages over conventional methods in which dimples or slits are formed on the die pad by stamping, punching or chemical etching methods.

Although preferred embodiments of the present invention have been described in detail herein above, it should be clearly understood that many variations and/or modifications of the basic inventive concepts herein taught which may appear to those skilled in the art will still fall within the spirit and scope of the present invention as defined in the appended claims.

What is claimed is:

1. A method for producing a lead frame for semiconductor device packages, comprising:

providing particles for mechanically impacting one or more surfaces of a lead frame material to produce a modified material having an uneven surface;

controlling formation of said dimples within desired ranges of at least one of size number and shape by adjusting at least one of a size of said particles, a concentration of said particles a speed of said lead frame material through said providing, and a pressure of said providing, while within these desired ranges, the dimples are randomly and irregularly formed;

leveling said modified material to produce a leveled modified material; and stamping said leveled modified material to produce said lead frame.

2. The method according to claim 1, further comprising:

prior to said step of modifying, preparing a lead frame material in a form of a reel of thin tape or a coil; and uncoiling said lead frame material using an uncoiling means.

3. The method according to claim 2, said step of modifying comprising:

introducing said lead frame material into a surface modification apparatus having injection means disposed above and below a path of said lead frame material;

injecting compressed air containing particle media onto said lead frame material forming dimples thereon to produce a dimpled material; and ejecting said dimpled material from said apparatus to produce said modified material.

4. The method according to claim 3, wherein during said injecting step, a concentration of said particle media contained in said compressed air is in a range of from about 100 g/l to about 200 g/l.

5. The method according to claim 4, wherein during said injecting step, said particle media has an average particle diameter of from about 10 to about 200 $\mu$m.

6. The method according to claim 5, wherein during said injecting step, said compressed air is injected at a pressure of from about 1.2 kg/cm$^2$ to about 4.5 kg/cm.

7. The method according to claim 1, wherein said providing particles includes injecting compressed air containing said particles onto said lead frame material forming dimples thereon to produce a dimpled material.

8. The method according to claim 1, wherein said particles are one of plastic resins, silicone resins, glass, and nutshell scraps.

9. The method according to claim 1, wherein said particles have different shapes.

* * * * *